United States Patent [19]

Matsuo et al.

[11] Patent Number: 4,729,063
[45] Date of Patent: Mar. 1, 1988

[54] PLASTIC MOLDED SEMICONDUCTOR INTEGRATED CIRCUIT DEVICE WITH NAIL SECTION

[75] Inventors: Ryuichi Matsuo; Masahide Kaneko; Hirokazu Harima, all of Itami, Japan

[73] Assignee: Mitsubishi Denki Kabushiki Kaisha, Tokyo, Japan

[21] Appl. No.: 831,279

[22] Filed: Feb. 20, 1986

[30] Foreign Application Priority Data

Feb. 22, 1985 [JP] Japan .................. 60-34888

[51] Int. Cl.$^4$ .............................. H05K 1/14
[52] U.S. Cl. ..................... 361/414; 357/71
[58] Field of Search ............ 361/414; 357/68, 71, 357/72

[56] References Cited

U.S. PATENT DOCUMENTS

| | | | |
|---|---|---|---|
| 3,291,578 | 12/1966 | Fahey | 357/71 X |
| 3,604,989 | 9/1971 | Haneta et al. | 357/72 X |
| 3,838,204 | 9/1974 | Ahn et al. | 361/414 X |
| 4,150,431 | 4/1979 | Nishihara et al. | 361/414 X |
| 4,502,210 | 3/1985 | Okumura et al. | 357/71 X |
| 4,617,730 | 10/1986 | Geldermans et al. | 357/71 X |
| 4,630,094 | 12/1986 | Wiley et al. | 357/71 X |

OTHER PUBLICATIONS

"Experimental and Mathematical Determination of Mechanical Strains Within Plastic IC Packages and Their Effect on Devices During Environmental Testing," R. J. Usell et al, IEEE/Proc. IPPS, pp. 65-73.
"Deformation of Al Metallization in Plastic Encapsulated Semiconductor Devices Caused by Thermal Shock", Masaaki Isagawa et al, 1980 IEEE.

Primary Examiner—J. R. Scott
Assistant Examiner—A. Jonathan Wysocki
Attorney, Agent, or Firm—Birch, Stewart, Kolasch & Birch

[57] ABSTRACT

A plastic molded semiconductor integrated circuit device, includes: a semiconductor substrate in which circuit elements are fabricated, metal wirings for transmitting the power supply voltage or signals of internal circuits provided on the semiconductor substrate via an insulating film, a plurality of apertures produced at portions of the insulating film directly below the metal wirings, and a nail section provided integrally with the metal wiring in the aperture, wherein the nail section is provided without being electrically connected with any of the circuit elements or the other metal wirings.

3 Claims, 12 Drawing Figures

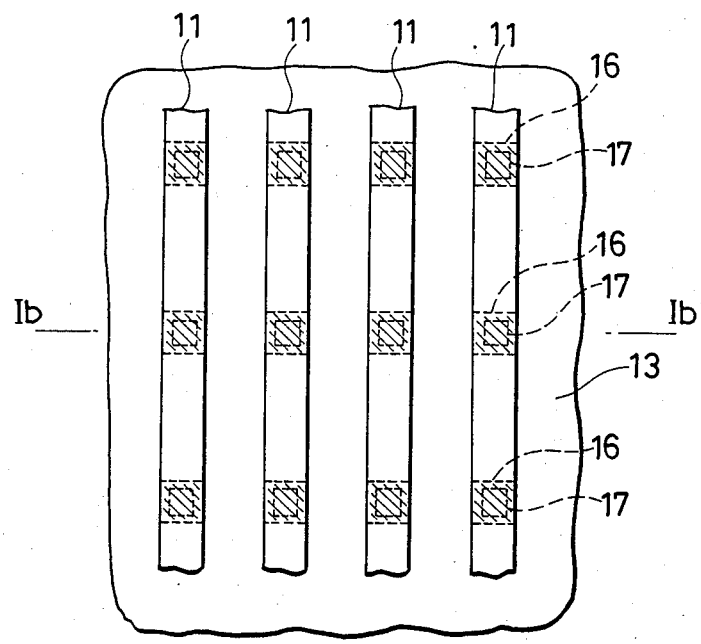
FIG. I (a)
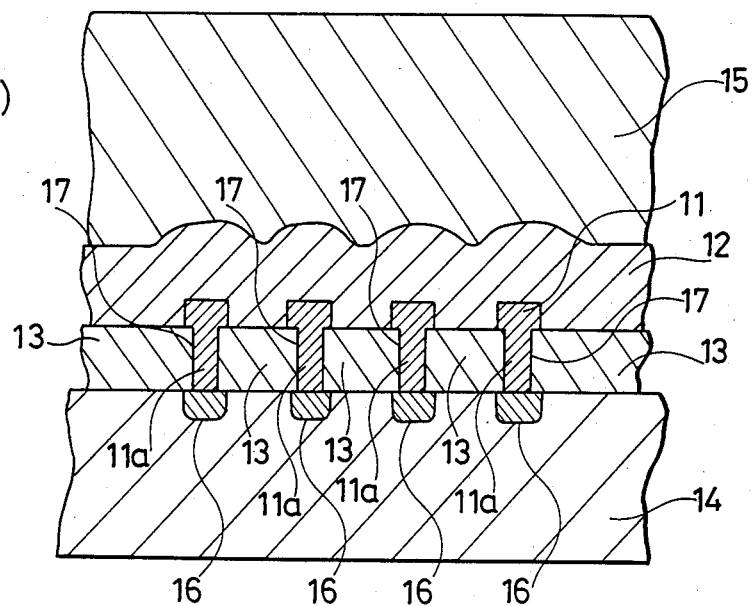
FIG. I (b)

(a)

PLASTIC MOLDED SEMICONDUCTOR INTEGRATED CIRCUIT DEVICE WITH NAIL SECTION

FIELD OF THE INVENTION

The present invention relates to a plastic molded semiconductor integrated circuit device, and more particularly to a device capable of avoiding the malfunctions caused by the transformation and the short-circuiting of the metal pattern wirings, wherein the transformation occurs caused by causing stress on the molding plastics.

BACKGROUND OF THE INVENTION

FIG. 6 shows a cross-sectional view of a package of a prior art plastic molded semiconductor integrated circuit device. In FIG. 6, the reference numeral 1 designates a plastic such as epoxy resin, the numeral 2 designates a metal lead frame, the numeral 3 designates a pewter such as Au or Ag. The numeral 4 designates a silicon chip, the numeral 5 designates a bonding pad such as aluminum, the numeral 6 designates an integrated circuit section, the numeral 7 designates a silicon chip protection film such as silicon nitride, and the numeral 8 designates a bonding wire.

The prior art plastic molded semiconductor integrated circuit device fails to be waterproof and has a problem of generating α-rays. Recently, however, the waterproofness thereof has been enhanced by reducing the impurity ions in the plastics and enhancing the adhesive characteristics of the plastics 1 against the silicon chip 4 and the lead frame 2. Furthermore, silica which has only a small number of α-ray generators is used as fillers for the plastics, and the reliability of such a plastic molded integrated circuit device is enhanced to a great extent (refer to articles "Plastic moldings where the damp-proofness is steadily enhanced", NIKKEI Electronics, Sept. 14, 1981, No. 273, pp. 118 to 135, and "The reliability of the semiconductor plastic molding", Technical Search Report of Electronics and Communication Society (reliability), March 1983, R82-81, pp. 23 to 28).

Recently, however, the oversizing of the integrated circuit chip and the miniaturization of the pattern width and pattern interval are rapidly enhanced, and if the metal pattern wirings inside the semiconductor integrated circuit transform due to the stress of the molding plastics, there occurs a short circuiting between the metal pattern wirings, resulting in a fault in the semiconductor integrated circuit device (refer to articles; "A slide phenomenon of a vapored aluminum wiring in the thermal bombardment of the plastic molded semiconductor element", Technical Search Report of Electronics and Communication Society (reliability), October 1979, R79-23 pp. 57 to 64, and "Epoxy sealing material for VLSI advancing in the lowering of stress", NIKKEI Electronics Micro Devices June 11, 1984, pp. 82 to 92).

FIGS. 7(a) and 7(b) show an elevational view of a normal metal pattern wiring, and the cross-sectional view of FIG. 7(a) on line VIIb to VIIb, respectively. FIGS. 8(a and 8(b) show an elevational view of the metal pattern wiring which is transformed by the stress of the plastics, and the cross-sectional view of FIG. 8(a) in line VIIIb to VIIIb, respectively. In both Figures, the reference numeral 11 designates a metal pattern wiring such as aluminum or molybdenum. The numeral 12 designates a chip protection film such as silicon nitride. The numeral 13 designates an insulating film such as silicon oxide. The numeral 14 designates a semiconductor substrate such as silicon. The numeral 15 designates a plastics such as epoxy resin. As shown in FIG. 8(b), if there occurs a short-circuiting between the metal pattern wirings 11 due to the stress of the plastics in the direction of Z, this, of course, leads to a malfunction of the integrated circuit.

The reason why the metal pattern wiring transforms as a result of the stress of the molding plastics is that the plastic molded semiconductor integrated circuit device is constituted of substances having different elasticity and different thermal expansions such as plastics 1, lead frame 2, and silicon chip 4 as shown in FIG. 6. A distortion of the plastics 1 is caused by a change in the temperature environment ocurring in the plastic molding process or after the product is completed and is transmitted to the metal pattern wiring of the integrated circuit section 6 through the chip protection film 7, thereby transforming the metal pattern wiring.

Such transformation of the metal pattern wiring is likely to occur not at the central portion of the integrated circuit, but at the peripheral circuit, especially at the four corners of the silicon chip and a portion of straight wiring extending from one edge of the chip to the other edge thereof. This is considered to be caused by the difference in thermal expansion between the plastics and the silicon chip being large close to the end of the device, and that a straight wiring is weak against stress applied from the vertical direction. And thus, it is generally considered that the short-circuiting caused by the transformation of the metal pattern wiring happens less when the metal pattern wiring is made rough near the periphery. Under such construction, however, the chip size becomes large, resulting in a costly device.

Furthermore, as a countermeasure against the transformation of the metal pattern wiring caused by the stress of the plastics, it has been attempted to lower the stress of the plastics by purification of the plastics itself, or to conduct a coating over the silicon chip surface by plastics such as polyimid before molding the silicon chip surface by plastics. However, both of these lead to increased processes and poor mass production capabilities, resulting in a costly device.

SUMMARY OF THE INVENTION

The present invention is directed to solve the problems pointed out above, and has for its object to provide a plastic molded semiconductor integrated circuit device capable of preventing the short-circuiting between the metal pattern wirings.

Other objects and advantages of the present invention will become apparent from the detailed description given hereinafter. It should be understood, however, that the detailed description and specific embodiment are given by way of illustration only, since various changes and modifications within the spirit and scope of the invention will become apparent to those skilled in the art from this detailed description.

According to the present invention, there is provided a plastic molded semiconductor integrated circuit device. The device includes: a semiconductor substrate in which circuit elements are fabricated, metal wirings for transmitting the power supply voltage or signals of internal circuits provided on the semiconductor substrate via an insulating film. A plurality of apertures produced at portions of the insulating film directly below the metal wirings, and a nail section provided integrally with the metal wiring in the aperture, wherein the nail section is provided without being electrically connected to any of the circuit elements or the other metal wirings.

BRIEF DESCRIPTION OF THE DRAWINGS

FIG. 1(a) is an elevational view showing the pattern of the plastic molded semiconductor integrated circuit device as one embodiment of the present invention, and FIG. 1(b) is a cross-sectional view thereof in the line Ib to Ib;

DETAILED DESCRIPTION OF THE PREFERRED EMBODIMENTS

Figure 2:
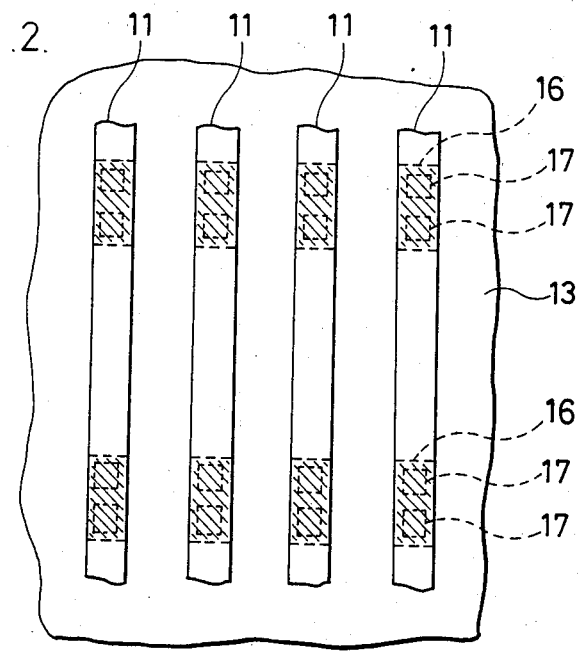
FIG. 2 is an elevational view showing a pattern of a second embodiment of the present invention.

In order to explain the present invention in detail, reference will be particularly made to FIG. 1.

The reference numeral 11 designates a metal pattern wiring consisting of a material such as aluminum or molybdenum. The numeral 12 designates a chip protection film including silicon nitride. The numeral 13 designates an insulating film including silicon dioxide. The numeral 14 designates a semiconductor substrate including silicon. The numeral 15 designates a plastic including an epoxy resin. The numeral 16 designates an impurity diffusion layer having a floating voltage which is produced by conducting a diffusion into the semiconductor substrate 14 directly below the metal pattern wiring 11. The numeral 17 designates a contact hole provided in the insulating film 13 at a desired interval so as to connect the metal pattern wiring 11 and the impurity diffusion layer 16. The numeral 11a designates a metal of the metal pattern wiring 11 which has flowed into the contact hole 17.

If it is supposed that the device is an N channel semiconductor device, then the semiconductor substrate 14 is a P type silicon substrate, and the impurity diffusion layer 16 is an N type impurity diffusion layer including impurities such as phosphor or arsenic. The meeting surface of the P type silicon substrate 14 and the N type impurity diffusion layer 16 constitute a PN junction diode, and the reverse direction break down voltage at which a break down occurs in the reverse direction from the N region to P region is normally about 30 to 40 volts. On the other hand, the signal voltage which is applied to the metal pattern wiring 11 including aluminum or molybdenum, is approximately 0 to 7 volts. Accordingly, the voltages of the metal pattern wiring 11 and of the N type impurity diffusion layer 16 are held as they are without passing through to the P type silicon substrate 14. Furthermore, the P type silicon substrate 14 is usually set at the ground level (0 volt), and therefore the N type impurity diffusion layer 16 is not likely to have a low voltage such that the voltage between the P region and the N region exceeds the forward direction diode voltage (approximately 0.7 volt). Thus, the voltages of the metal pattern wiring 11 and of the N type impurity diffusion layer 16 are held stable at the values given from the output of the circuit. That is, the voltages are not short circuited into the semiconductor substrate in a normal operating range of signal and power supply voltages.

In this embodiment under such a construction, a contact hole 17 is provided at the insulating film 13 so as to connect one portion of the metal pattern wiring 11 to the impurity diffusion layer 16, and the metal 11a of the metal pattern wiring 11 which has flowed into the contact hole 7, whereby the metal section 11a at the contact hole 17 functions as a nail, and the transformation of the metal wiring which may occur from the distortion of the plastic due to a change in the temperature of the environment in the plastic molding process or after the product is completed is reduced to a great extent.

Furthermore, in this embodiment, it is possible to avoid a short-circuiting between the metal wirings which may occur from the stress of the plastics with no need for providing a rough peripheral pattern, using a low stress and highly purified plastic, or of conducting a coating over the surface of the silicon chip by a material such as a polyimid. This enables the production of a low cost and highly reliable device.

The impurity diffusion layer can be made at the same time as the impurity diffusion layers which constitute sources or drains of transistors, and the conductivity layer can be of the same material as that which constitutes gates of transistors, thereby realizing a low cost device without the need for adding any semiconductor process to the conventional method.

The contact between the metal pattern wiring 11 and the impurity diffusion layer 16 at the contact hole 17 is preferably as great as possible so as to reduce the transformation of the metal pattern wiring 11 caused by the stress of the plastics 15. However, the impurity diffusion layer 16 has a capacitance of 2 to $6 \times 10^{-4}$ pF/$\mu$m$^2$, and therefore too many contacts connecting the metal pattern wiring 11 and the impurity diffusion layer 16 will unfavorably retard the response speed of the signal transmitted by the metal pattern wiring 11. So, there should be provided an appropriate number of contacts whose number is in a range where those contacts may not affect the response speed, while considering the driving ability of the internal circuits for outputting required signals.

FIG. 2 shows a second embodiment of the present invention. In this embodiment a plurality of contact holes 17 for contacting the metal pattern wiring 11 and the impurity diffusion layer 16 are serially arranged in each group.

Figure 3:
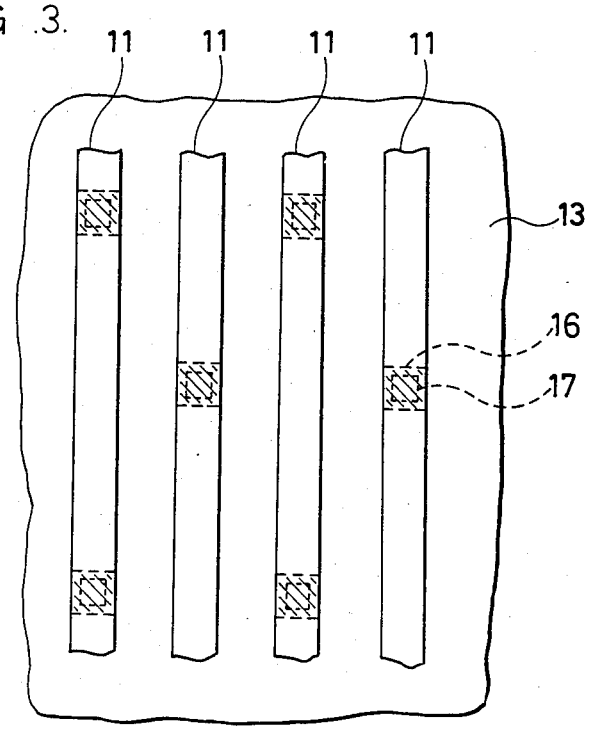
FIG. 3 is an elevational view showing a pattern of a third embodiment of the present invention.

FIG. 3 shows a third embodiment of the present invention, wherein the positions of the contact holes 17 of mutually adjacent metal wirings 11 are arranged apart from each other. This also produces the same effect as the first embodiment.

Figure 4:
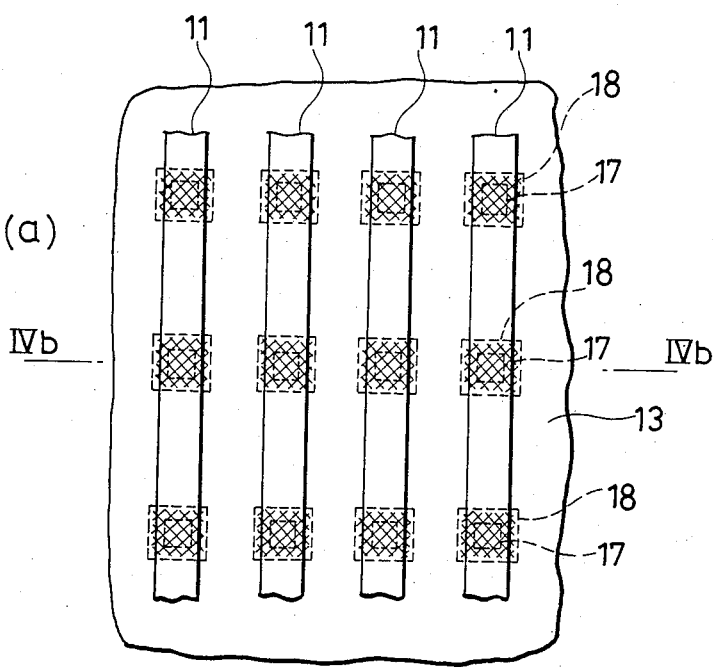
FIG. 4(a) is an elevational view showing the pattern of a plastic molded semiconductor integrated circuit device of a fourth embodiment of the present invention.
FIG. 4(b) is a cross-sectional view thereof in the line IVb to IVb.
Figure 4:
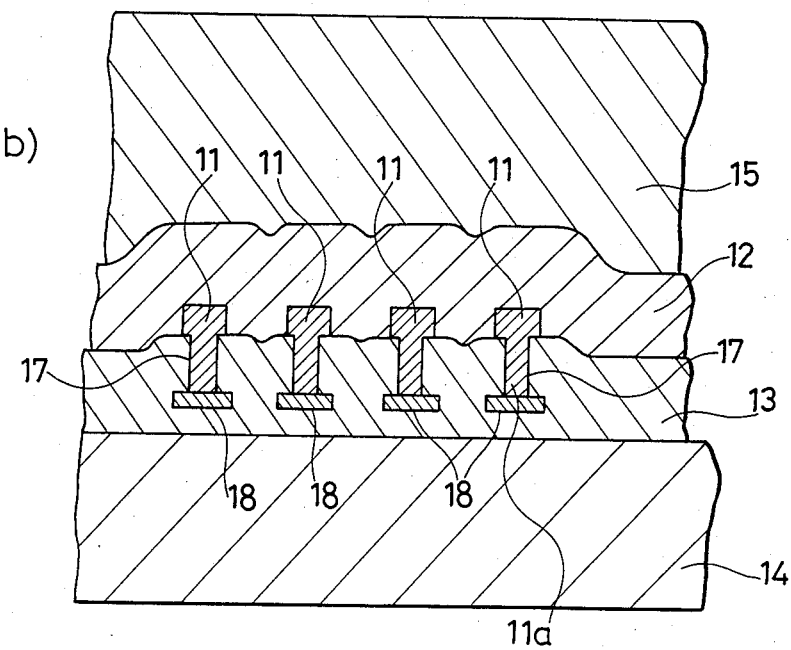

FIG. 4 shows a fourth embodiment of the present invention, wherein a conductivity layer 18 includes polysilicon or molybdenum, each portion of which becomes a gate of a transistor is produced in the insulating film 13. In this embodiment, the position of the lower end of the metal pattern wiring portion 11a embedded in the contact hole 17 is restricted up to the conductivity layer 18, and the embedded portion is shallow as compared to FIGS. 1 and 3. Accordingly, in this embodiment the transformation of the metal pattern wiring caused by the stress of the plastic 15 is more likely to occur than the above described embodiments if the same number of contact holes 17 are provided. However, the capacity of the conductivity layer 18 which has a value of 0.5 to $1.5 \times 10^{-4}$ pF/$\mu$m$^2$ is sufficiently small as about one by four of that of the impurity diffusion layer. Accordingly, even if there are provided a large number of conductivity layers 18 and contact holes 17 to compensate for the weakness of the metal wirings against the transformation, there is no unfavorable influence upon the response speed.

Figure 5:
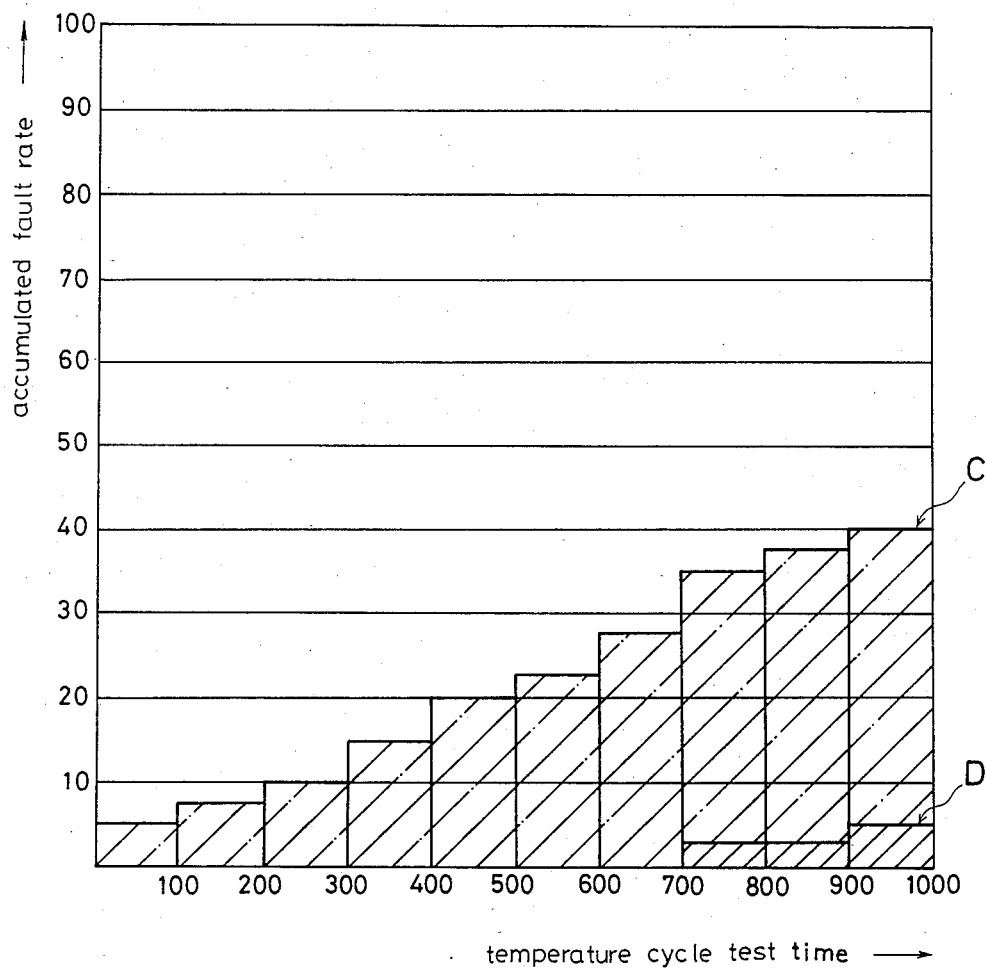
FIG. 5 is a graph showing the characteristics between the temperature cycle test time and the accumulated fault rate for both of the second embodiment of the present invention and the prior art device.
Figure 6:
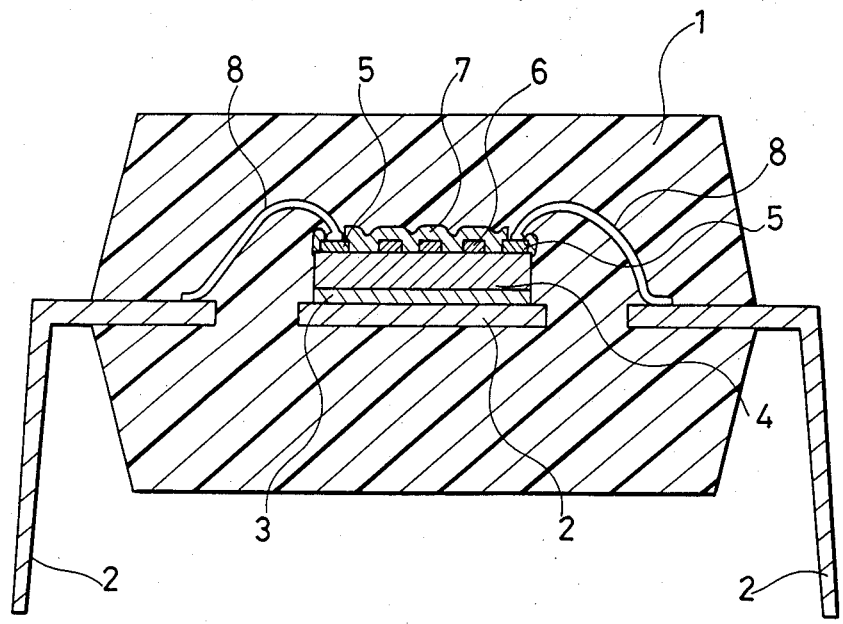
FIG. 6 is a cross-sectional view showing a package of a plastic molded semiconductor integrated circuit deivce.
Figure 7A:
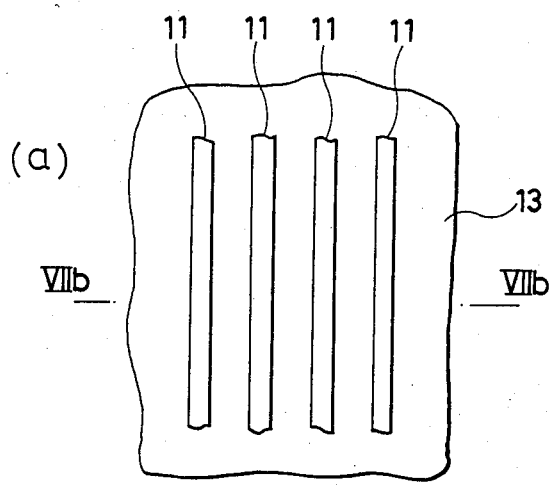
FIG. 7(a) is an elevational view showing the pattern of a normal metal pattern wiring.
Figure 7B:
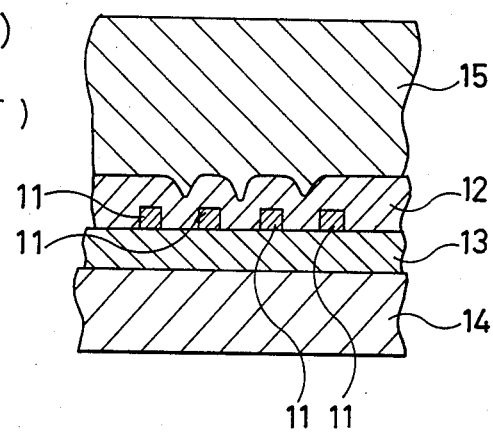
FIG. 7(b) is a cross-sectional view thereof in line VIIb to VIIb.
Figure 8:
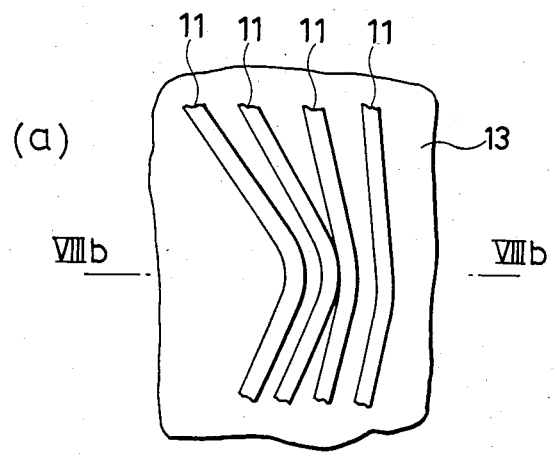
FIG. 8(a) is an elevational view showing the pattern of a metal pattern wiring which is transformed by the stress of the plastics.
FIG. 8(b) is a cross-sectional view thereof in line VIIIb to VIIIb.
Figure 8B:
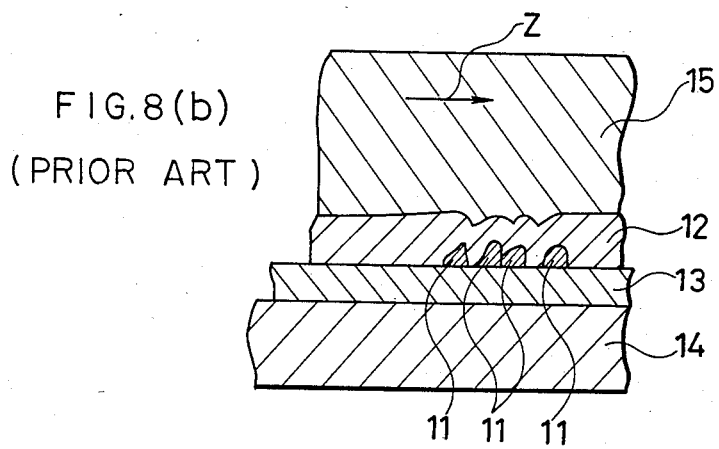

FIG. 5 shows comparative data of the characteristics of the second embodiment and the prior art device obtained in a temperature cycle test. The longitudinal axis denotes the accumulated fault ratio (%) caused by the metal wiring transformation, and the transverse axis denotes the test time of the temperature cycle test under the temperature of $-65°$ C./$+150°$ C. and the cycle of 1 cycle/1 hour. As an element to be measured it is used a 28 pin DIL package having a chip size of about $7.0 \times 7.0$ mm$^2$ when the width and the interval of the metal wirings are both 3.0 $\mu$m. The bar graph C represents the characteristics of the prior art device, and the bar graph D represents that of the second embodiment (FIG. 2).

In the second embodiment, the wider one of the intervals between the contact holes 17, that is, the interval of the second contact hole and the third contact hole among the four contact holes 17 arranged in the vertical direction in FIG. 2, is set about 300 $\mu$m.

From FIG. 5, it is understood that the fault ratio is 40% in the prior art device (graph C), and 5% in the second embodiment (graph D), showing a large difference when the temperature cycle test time amounts to 1000. It is generally said that there is no problem in a practical use if the device can withstand 100 times its temperature in a test under such a condition, and the second embodiment of the present invention can afford sufficiently a practical use, meaning a good result.

According to the present invention, an impurity diffusion layer having a floating voltage is provided on the semiconductor substrate directly below the metal wiring, or a conductivity layer having a floating voltage is provided embedded in the insulating film, and the metal wiring and the diffusion layer or the conductivity layer are connected with each other by the metal of the metal wiring provided at positions where the insulating film between the metal wiring and the diffusion layer or between the conductivity layers is removed at a desired interval. Thus, the connecting portion of metal which functions as a nail, and thus the transformation of the metal wiring is reduced to a great extent even though a distortion of the plastics occurs due to a change in the temperature of the environment in the plastic molding process or after the product is completed.

What is claimed is:

1. A plastic molded semiconductor integrated circuit device, comprising:
   a semiconductor substrate in which circuit elements are fabricated;
   metal wirings for transmitting a power supply voltage or signals of internal circuits, said metal wirings being provided on the semiconductor substrate via an insulating film;
   a plurality of apertures formed at portions of the insulating film directly below said metal wirings; and
   a nail section formed integrally with said metal wiring in said plurality of apertures, wherein said nail section is electrically independent from any of the circuit elements or the other metal wirings.

2. A plastic molded semiconductor integrated circuit device, comprising:
   a semiconductor substrate;
   metal wirings for transmitting a power supply voltage or signals of internal circuits;
   impurity diffusion layer means permitting voltages on said metal wirings to vary over a predetermined range without shorting into said semiconductor substrate, said diffusion layer means being produced by diffusing material into the semiconductor substrate directly below said metal wirings; and
   an insulating film provided between said metal wirings and said impurity diffusion layer means;
   wherein a portion of the metal of said metal wirings are extend into apertures formed in said insulating film at predetermined intervals for electrically connecting metal wirings and said impurity diffusion layer means.

3. A plastic molded semiconductor integrated circuit device, comprising:
   metal wirings for transmitting a supply voltage power or signals of internal circuits;
   an insulating film formed between said metal wirings and a semiconductor substrate formed directly below said metal wirings; and
   conductivity layer means for permitting voltages on said metal wirings to vary over a predetermined range without shorting into said semiconductor substrate, said conductivity layer means being formed in said insulating film at predetermined intervals;
   wherein portions of metal of said metal wirings extend into apertures provided at a position above said conductivity layer of said insulating film for electrically connecting said metal wirings and said conductivity layer means.

* * * * *